United States Patent
Van Herpen et al.

(10) Patent No.: US 7,355,672 B2
(45) Date of Patent: Apr. 8, 2008

(54) METHOD FOR THE REMOVAL OF DEPOSITION ON AN OPTICAL ELEMENT, METHOD FOR THE PROTECTION OF AN OPTICAL ELEMENT, DEVICE MANUFACTURING METHOD, APPARATUS INCLUDING AN OPTICAL ELEMENT, AND LITHOGRAPHIC APPARATUS

(75) Inventors: Maarten Marinus Johannes Wilhelmus Van Herpen, Heesch (NL); Vadim Yevgenyevich Banine, Helmond (NL); Johannes Hubertus Josephina Moors, Helmond (NL); Carolus Ida Maria Antonius Spee, Helmond (NL); Derk Jan Wilfred Klunder, Nijverdal (NL)

(73) Assignee: ASML Netherlands B.V., Veldhoven (NL)

( * ) Notice: Subject to any disclaimer, the term of this patent is extended or adjusted under 35 U.S.C. 154(b) by 223 days.

(21) Appl. No.: 10/956,344

(22) Filed: Oct. 4, 2004

(65) Prior Publication Data
US 2006/0072084 A1    Apr. 6, 2006

(51) Int. Cl.
*G03B 27/52* (2006.01)
*G03B 27/42* (2006.01)
*G03B 27/32* (2006.01)
*C23G 1/00* (2006.01)
*G03C 5/00* (2006.01)

(52) U.S. Cl. ............... 355/30; 355/53; 355/77; 134/2; 430/311

(58) Field of Classification Search ......... 355/53, 355/30, 67, 77; 134/2, 1, 1.1, 1.2, 1.3, 4; 359/838; 430/311
See application file for complete search history.

(56) References Cited

U.S. PATENT DOCUMENTS 4,447,469 A * 5/1984 Peters .............. 438/762

(Continued)

FOREIGN PATENT DOCUMENTS

EP      1 403 715 A2    3/2004

(Continued)

OTHER PUBLICATIONS

Akihisa Matsuda, "Growth mechanism of microcrystalline silicon obtained from reactive plasmas", Thin Solid Films, vol. 337, pp. 1-6, (1999) XP004197084.

(Continued)

*Primary Examiner*—Alan Mathews
(74) *Attorney, Agent, or Firm*—Pillsbury Winthrop Shaw Pittman LLP

(57) ABSTRACT

A method for the removal of a deposition on an optical element of an apparatus including the optical element includes providing an $H_2$ containing gas in at least part of the apparatus includes producing hydrogen radicals from $H_2$ from the $H_2$ containing gas; and bringing the optical element with deposition into contact with at least part of the hydrogen radicals and removing at least part of the deposition. Further, a method for the protection of an optical element of an apparatus including the optical element includes providing a cap layer to the optical element by a deposition process; and during or after use of the apparatus, removing at least part of the cap layer from the optical element in a removal process as described above. The methods can be applied in a lithographic apparatus.

33 Claims, 4 Drawing Sheets

U.S. PATENT DOCUMENTS

| | | | |
|---|---|---|---|
| 5,099,557 A * | 3/1992 | Engelsberg | 29/25.01 |
| 5,466,942 A * | 11/1995 | Sakai et al. | 250/492.2 |
| 5,539,211 A * | 7/1996 | Ohtoshi et al. | 250/441.11 |
| 5,981,960 A * | 11/1999 | Ooaeh et al. | 250/492.2 |
| 6,105,589 A * | 8/2000 | Vane | 134/1.1 |
| 6,427,703 B1 * | 8/2002 | Somekh | 134/1.1 |
| 6,614,505 B2 * | 9/2003 | Koster et al. | 355/30 |
| 2001/0055104 A1 * | 12/2001 | Irie | 355/53 |
| 2002/0084425 A1 | 7/2002 | Klebanoff et al. | |
| 2003/0095240 A1 * | 5/2003 | Van Schaik et al. | 355/30 |
| 2003/0169520 A1 * | 9/2003 | Goldstein | 359/845 |
| 2004/0011381 A1 | 1/2004 | Klebanoff et al. | |
| 2004/0165160 A1 * | 8/2004 | Van Beek et al. | 355/30 |
| 2005/0073663 A1 * | 4/2005 | Miyajima | 355/30 |

FOREIGN PATENT DOCUMENTS

| | | |
|---|---|---|
| EP | 1 406 124 A1 | 4/2004 |
| EP | 1 429 189 A1 * | 6/2004 |

OTHER PUBLICATIONS

Takeshi Akatsu et al., "GaAs wafer bonding by atomic hydrogen surface cleaning", Journal of Applied Physics, vol. 86, No. 12, (Dec. 15, 1999) XP012048214.

European Search Report dated Dec. 22, 2005.

* cited by examiner

METHOD FOR THE REMOVAL OF DEPOSITION ON AN OPTICAL ELEMENT, METHOD FOR THE PROTECTION OF AN OPTICAL ELEMENT, DEVICE MANUFACTURING METHOD, APPARATUS INCLUDING AN OPTICAL ELEMENT, AND LITHOGRAPHIC APPARATUS

BACKGROUND OF THE INVENTION

1. Field of the Invention

The present invention relates to a method for the removal of deposition on an optical element, a method for the protection of an optical element, a device manufacturing method, an apparatus including an optical element, and a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that example, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the inherent production of fast ions and atoms, which are expelled from the plasma in all directions. These particles can be damaging to the collector and condenser mirrors which are generally multilayer mirrors, with fragile surfaces. This surface is gradually degraded due to the impact, or sputtering, of the particles expelled from the plasma and the lifetime of the mirrors is thus decreased. The sputtering effect is particularly problematic for the collector mirror. The purpose of this mirror is to collect radiation which is emitted in all directions by the plasma source and direct it towards other mirrors in the illumination system. The collector mirror is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

In order to prevent the damage of the collector mirror by debris particles, U.S. Patent Application Publication 2002/0051124 A1 discloses a cap layer on the mirror surface to protect the mirror from sputtering damage caused by fast ions and atoms expelled from a plasma source. Hydrocarbons are added to a space containing the mirror, and they physically or chemically adsorb to the surface of the mirror and thus form a protective layer on the surface. This surface layer is made up of the hydrocarbon molecules and possibly other contaminant particles present in the system as impurities, together with any further molecules which are introduced into the system from the gas supply. When the fast ions and atoms produced by the plasma hit the surface of the mirror, they contact the protective layer thereby dislodging the hydrocarbon molecules from the cap layer, and damage to the mirror surface itself is avoided. A dynamic cap layer may be used. This is a cap layer which is continually sputtered away and replaced with further molecules and thus the thickness of the layer remains substantially constant or within an acceptable range. In order to achieve this, the reflectivity of the mirror and/or the background pressure of the space are monitored.

In the near future, extreme ultraviolet (EUV) sources may use tin or another metal vapor to produce EUV radiation. This tin may leak into the lithographic apparatus, and will be deposited on mirrors in the lithographic apparatus, e.g., the mirrors of the radiation collector. The mirrors of such a radiation collector are foreseen to be multilayered and may have a EUV reflecting top layer of ruthenium (Ru). Deposited layers of more than approximately 10 nm tin (Sn) on the reflecting Ru layer will reflect EUV radiation in the same way as bulk Sn. It is envisaged that a layer of 10 nm Sn is deposited very quickly near a Sn-based EUV source. The overall transmission of the collector will decrease significantly, since the reflection coefficient of tin is much lower than the reflection coefficient of ruthenium. The method of U.S. Patent Application Publication 2002/0051124 A1 is not suited to remove, for example, Sn deposition from the surface of optical elements like mirror surfaces, nor is it suited to remove, for example, Si deposition from optical elements. U.S. Patent Application Publication 2002/0051124 A1 also does not address sputtering of particles and other contaminants on optical elements. An improved method is therefore desireable to address this problem.

SUMMARY OF THE INVENTION

It is an aspect of the present invention to provide a method for the removal of a deposition on an optical element of an apparatus including the optical element. It is a further aspect of the present invention to provide a method for the protection of an optical element of an apparatus including the optical element. It is yet a further aspect of the present invention to provide a device manufacturing method. It is another aspect of the present invention to provide an apparatus including an optical element, for example a lithographic apparatus, wherein the method of the invention can be applied.

According to an embodiment of the present invention, a method for the removal of a deposition on an optical element of an apparatus including the optical element includes providing a $H_2$ containing gas in at least part of the apparatus; producing hydrogen radicals from $H_2$ from the $H_2$ containing gas; and bringing the optical element with deposition into contact with at least part of the hydrogen radicals and removing at least part of the deposition.

In another embodiment, the deposition includes one or more elements selected from B, C, Si, Ge and Sn. C (carbon) may, for example, be a deposition on the optical element due to the undesired presence of hydrocarbons in the apparatus, like a lithographic apparatus, but may also be deliberately present as protective cap layer. Si (silicon) may also be deliberately present as protective cap layer, whereas Sn (tin) may be present due to a source that produces Sn. Further, Si may be present as deposition due to outgassing of the resist. In a further embodiment, at least part of the hydrogen radicals are generated from $H_2$ from the $H_2$ containing gas by one or more radical formation devices selected from a hot filament, a plasma, radiation, and a catalyst for converting $H_2$ into hydrogen radicals. The hydrogen radical reacts with Sn (or Sn oxides), C, Si (or Si oxides), etc., leading to volatile hydrides that can be removed by, for example, an exhaust. Sn and Si, that may have oxidized or which may be at least partially present as oxide as deposition or cap layer may be reduced to elemental Sn and Si, respectively, and may be removed as hydride or as halogenide. Therefore, in yet another embodiment, the $H_2$ containing gas may further include a halogen gas. The halogens may form volatile halides, and may improve the removal of e.g. Sn and Si deposition.

According to an embodiment of the present invention, a method for the protection of an optical element of an apparatus including the optical element includes providing a cap layer to the optical element by a deposition process; and during or after use of the apparatus, removing at least part of the cap layer from the optical element in a removal process including providing an $H_2$ containing gas in at least part of the apparatus; producing hydrogen radicals from $H_2$ from the $H_2$ containing gas; and bringing the optical element with the cap layer into contact with at least part of the hydrogen radicals and removing at least part of the cap layer.

In another embodiment, the process for providing a cap layer to the optical element by a deposition process includes providing a starting material including one or more elements selected from B, C, Si and Ge; providing from the starting materials species including one or more elements selected from B, C, Si and Ge that are able to provide a deposition; and bringing the species that are able to generate a deposition into contact with at least part of the optical element.

In yet another embodiment, the process for providing a cap layer to the optical element by a deposition process includes providing a gas including one or more elements selected from the group B, C, Si and Ge; providing from the gas species including one or more elements selected from B, C, Si and Ge that are able to generate a deposition; and bringing the species that are able to generate a deposition into contact with at least part of the optical element.

The deposition can be used as cap layer. Species that can be used to provide a cap layer are, for example,. Si and C, and also B (boron) or Ge (germanium) atoms and particles, and also intermediate products like e.g. $SiH_2$ may form (Si) depositions. Hence, the starting material may include a gas, for example, including boron hydrides, hydrocarbons, silanes, or germanium hydrides, or combinations of two or more of them. In an embodiment of the present invention, the species that are able to provide a deposition are provided by a hot filament, a plasma or radiation. In another embodiment, the cap layer is generated by hot filament deposition, and in yet a further embodiment, the cap layer is generated by hot filament deposition of one or more elements selected from B (derived from, for example, boron hydrides, such as $BH_3$), C (derived from, for example, a hydrocarbon, such as $CH_4$), Si (derived from, for example, a silane, such as $SiH_4$) and Ge (derived from, for example, germanium hydrides, such as $GeH_4$). In another embodiment, instead of chemical vapor deposition, the species that are able to provide a deposition are provided by physical vapor deposition and as starting materials instead of gasses, oxides or metals of, for example, Si and Ge can be applied. Elemental Si and Ge is evaporated or sputtered away as species that can be deposited on the optical element. Hence, in an embodiment, the cap layer includes one or more elements selected from B, C, Si and Ge.

In another embodiment of the present invention, the apparatus is a lithographic apparatus. Further, in another embodiment of the present invention, the optical element includes a mirror or a grating, for example a collector mirror or a multi-layer mirror. In another embodiment, the optical element includes a sensor or a reticle.

In yet another embodiment, the apparatus is designed to irradiate the optical element with a radiation beam. In another embodiment, the optical element includes a sensor and is designed to align other optical elements or parts of the apparatus (for example the mask, the waver, the mask table, the wafer table, etc.). The apparatus including the optical element may be designed to provide a radiation beam, such as a lithographic apparatus. In yet another embodiment, the optical element includes a sensor that is designed to measure properties of other optical elements, for example the optical property of reflection of a collector mirror. In yet a further embodiment, the radiation includes EUV radiation having a wavelength selected from the range of 5-20 nm. In yet another embodiment, the radiation includes radiation having a wavelength selected from 365 nm, 248 nm, 193 nm, 157 nm, 126 nm, but the radiation may also include other wavelengths that may be used in lithographic applications.

During or after use of the optical element, the cap layer may partially or completely be removed. In an embodiment, the use of the apparatus includes irradiating the optical element with a radiation beam, for example the use of a lithographic apparatus applying EUV radiation. During use the cap layer may be deteriorated, due to, for example, deposition of Sn and/or sputtering away of a part of the cap layer, for example by Sn particles from the source. Therefore, after use, or even during use, the cap layer may be at least partially removed and a fresh cap layer may be generated, either on the optical element or on the partially removed cap layer on the optical element. Hence, in another embodiment, during at least part of the use of the apparatus Sn deposits on at least part of the cap layer or removes at least part of the cap layer. Therefore, in a further embodiment, the deposition includes at least Sn, and in a variation thereon, the cap layer includes at least Sn. During use, both processes, deposition and removal, may occur, thereby providing a deteriorated cap layer. In a further embodiment, during at least part of the use of the apparatus Si deposits on at least part of the cap layer, for example due to outgassing from the resist. Hence, in another embodiment, the deposition includes at least Si, and in a variation thereon, the cap layer includes at least Si.

In another embodiment, the cap layer is removed in the removal process by etching, and in yet another embodiment, the cap layer is removed in the removal process by bringing the cap layer into contact with hydrogen radicals. The hydrogen radicals may be generated in different ways. In an embodiment of a method according to the present invention, at least part of the hydrogen radicals are generated from $H_2$ from the $H_2$ containing gas by one or more radical formation devices selected from a hot filament, a plasma, radiation, and a catalyst for converting $H_2$ into hydrogen radicals, which dissociate $H_2$ to H radicals or H-atoms adsorbed to the surface of the catalyst. The catalyst may include transition metal based catalysts such as catalysts including Pd, Pt, Rh, Ir and Ru. The catalyst may also include a Ru layer, for example the surface of a grazing incidence mirror or of a multilayer, wherein Ru is included in a top layer. The radiation for producing radicals may include radiation such as EUV radiation, DUV radiation, UV radiation, for example radiation including radiation having a wavelength selected from 193 mn, 157 nm and 126 run, and the radiation may include radiation such as electron beam or ionizing radiation, such that hydrogen radicals may be formed from hydrogen.

According to a further embodiment of the present invention, a method is provided wherein at least part of the cap layer is provided ex situ from the apparatus including the optical element, and according to yet a further embodiment, a method is provided wherein at least part of the cap layer is removed ex situ from the apparatus including the optical element.

According to a further embodiment of the present invention, a device manufacturing method includes providing a lithographic apparatus including an illumination system and a projection system, the lithographic apparatus further including an optical element; projecting a patterned beam of radiation onto a target portion of a substrate at least partially covered by a layer of radiation sensitive material; providing a cap layer to the optical element by a deposition process; and during or after use of the apparatus, removing at least part of the cap layer from the optical element in a removal process including providing an $H_2$ containing gas in at least part of the apparatus; producing hydrogen radicals from $H_2$ from the $H_2$ containing gas; and bringing the optical element with the cap layer into contact with at least part of the hydrogen radicals and removing at least part of the cap layer.

According to a still further embodiment of the present invention, an apparatus includes an optical element; an inlet configured to provide an $H_2$ containing gas in at least part of the apparatus; and a hydrogen radical generator configured to generate radicals from $H_2$ from the $H_2$ containing gas.

According to a further embodiment, the apparatus includes an optical element; an inlet configured to provide an $H_2$ containing gas in at least part of the apparatus; a hydrogen radical generator configured to generate radicals from $H_2$ from the $H_2$ containing gas; and a deposition generator, wherein the deposition includes one or more elements selected from B, C, Si and Ge.

According to yet a further embodiment, a hydrogen radical generator includes a radical formation device selected from a filament that can be heated, a plasma generator, a source of radiation, and a catalyst configured to convert $H_2$ into hydrogen radicals. Ru is included in a top layer. The source of radiation may be a source configured to produce radiation such as EUV radiation, DUV radiation, UV radiation, for example radiation including radiation having a wavelength selected from the group of 193 nm, 157 nm and 126 nm, and the source of radiation may produce radiation such as electron beam or ionizing radiation, such that hydrogen radicals may be formed from hydrogen. In another embodiment, the source of a lithographic apparatus is used as source of radiation to produce radicals.

According to another embodiment, the deposition generator is configured to generate a deposition including one or more elements selected from B, C, Si and Ge, and includes a device selected from a filament that can be heated, a generator for generating a plasma and a source of radiation.

According to yet another embodiment, an apparatus includes an inlet configured to provide a gas including one or more elements selected from B, C, Si and Ge. The gas can be introduced such that species can be produced, for example, by a hot filament to generate a cap layer on the optical element. In yet a further embodiment, the apparatus further includes an inlet configured to provide a starting material.

According to yet another embodiment of the present invention, a lithographic apparatus includes an optical element; an illumination system configured to condition a radiation beam; a support configured to support a patterning device, the patterning device being configured to impart the radiation beam with a pattern in its cross-section to form a patterned radiation beam; a substrate table configured to hold a substrate; a projection system configured to project the patterned radiation beam onto a target portion of the substrate; an inlet configured to provide an $H_2$ containing gas in at least part of the apparatus; and a hydrogen radical generator configured to generate radicals from $H_2$ from the $H_2$ containing gas.

According to yet a further embodiment, a lithographic apparatus includes an optical element; an illumination system configured to condition a radiation beam; a support configured to support a patterning device, the patterning device being configured to impart the radiation beam with a pattern in its cross-section to form a patterned radiation beam; a substrate table configured to hold a substrate; a projection system configured to project the patterned radiation beam onto a target portion of the substrate; an inlet configured to provide an $H_2$ containing gas in at least part of the apparatus; a hydrogen radical generator configured to generate radicals from $H_2$ from the $H_2$ containing gas; and a deposition generator, wherein the deposition includes one or more elements selected from B, C, Si and Ge.

According to yet another embodiment of the present invention, a method for the removal of a deposition on an optical element of an apparatus including the optical element, and wherein the deposition includes one or more elements selected from the group consisting of B, Si, Ge and Sn, includes providing an $H_2$ containing gas in at least part of the apparatus; producing hydrogen radicals from $H_2$ from the $H_2$ containing gas; and bringing the optical element with deposition into contact with at least part of the hydrogen radicals and removing at least part of the deposition.

In yet a further embodiment, the deposition includes at least Si.

According to yet another embodiment of the present invention, an apparatus includes an optical element; and a deposition generator configured to provide a deposition including Sn.

In yet a further embodiment, the apparatus further includes an inlet configured to providing a starting material including Sn. The starting material may be a gas that can be used to generate a cap layer with CVD techniques, for example using a hot filament, but the starting material may also be a metal or oxide of Sn, which may provide elemental Sn to be deposited by PVD techniques.

According to another embodiment, the apparatus is a lithographic apparatus for EUV lithography.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
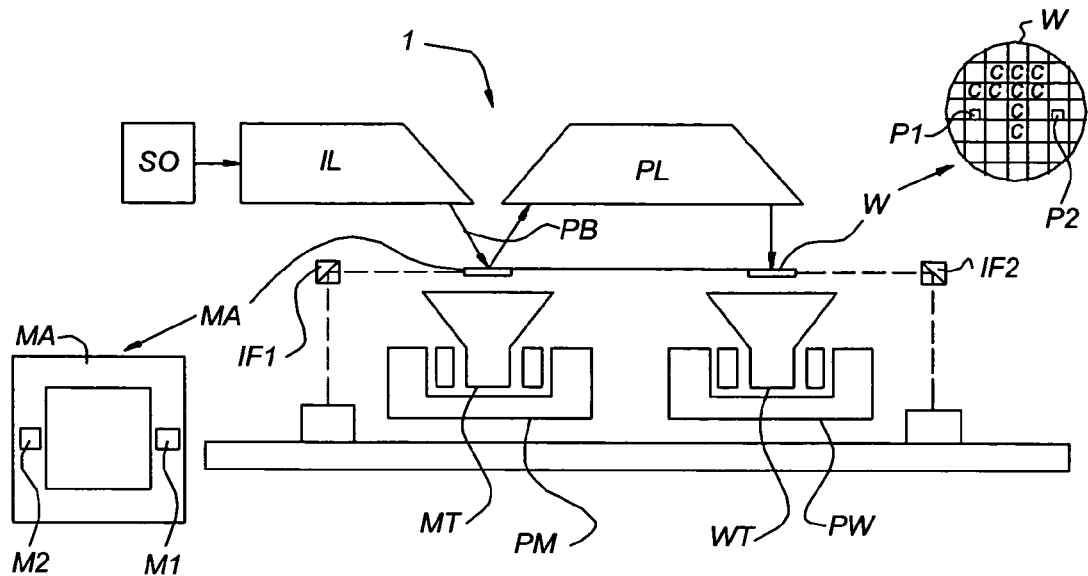
FIG. 1 schematically depicts a lithographic apparatus according to an embodiment of the invention.

FIG. 1 schematically depicts a lithographic apparatus 1 according to an embodiment of the present invention. The apparatus 1 includes an illumination system (illuminator) IL configured to condition a radiation beam B (e.g. UV radiation or EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PL is configured to project the patterned radiation beam B onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support MT supports, for example bears the weight of, the patterning device MA. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system.

Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type, for example employing a reflective mask. Alternatively, the apparatus may be of a transmissive type, for example employing a transmissive mask.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a delivery system BD including, for example, suitable directing mirrors and/or a beam expander. In other cases the source may be an integral part of the lithographic apparatus, for example when the source is a mercury lamp.

The source SO and the illuminator IL, together with the beam delivery system BD if required, may be referred to as a radiation system.

The illuminator IL may include an adjusting device AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioning device PW and a position sensor IF2 (e.g. an interferometric device, linear encoder or capacitive sensor), the substrate table WT can be moved accurately, e.g. so as to position different target portions C in the path of the radiation beam B. Similarly, the first positioning device PM and a position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions. These are known as scribe-lane alignment marks. Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The term "lens", where the context allows, may refer to any one or combination of various types of optical components, including refractive, reflective, magnetic, electromagnetic and electrostatic optical components.

In the context of the present invention, "optical element" includes one or more elements selected from optical filters, optical gratings, mirrors such as multilayer mirrors, grazing incidence mirrors, normal incidence mirrors, collector mirrors, etc, lenses, reticles, diodes, sensors such as intensity measurements sensors, energy sensors, CCD sensors, alignments sensors such as optical alignment sensors, gas barrier structures, for example as described in U.S. Pat. Nos. 6,614,505 and 6,359,969, which are incorporated herein by reference, etc. Such optical elements, such as filters, gratings, mirrors or lenses may be flat or curved and may be present as layer, foil, device etc. In an embodiment of the present invention, optical elements such as optical filters, optical gratings, mirrors, like multilayer mirrors, grazing incidence mirrors, normal incidence mirrors, collector mirrors, lenses, etc., may be blazed or optimized for radiation with a predetermined wavelength $\lambda$ (like 5-20 nm, i.e. EUV radiation, 248 nm, 193 nm, 157 nm or 126 nm, etc). They may also be transmissive to radiation with wavelengths $\lambda$ in the case of lenses, or reflective in the case of mirrors, or diffractive in the case of gratings. Some optical elements may provide one or more of these optical effects, see for example European Patent application no. 03077155 and European Patent application no. 03077850, which are incorporated herein by reference.

The term "layer" as used herein, as understood by those of ordinary skill in the art, may describe layers having one or more boundary surfaces with other layers and/or with other media such as vacuum in use. However, it should be understood that "layer" may also mean part of a structure. The term "layer" may also indicate a number of layers. These layers can be, for example, next to each other or on top of each other, etc. They may also include one material or a combination of materials. It should also be noted that the term "layers" used herein may describe continuous or discontinuous layers. In the present invention, the term "material" used herein may also be interpreted as a combination of materials. The term "deposition" herein refers to material that is chemically or physically attached to a surface (e.g. the surface of an optical element), as known to those of ordinary skill in the art. Such deposition may be a layer, but it may also include a multi-layer structure. The deposition may include a cap layer but it may also include undesired deposits like sputtered (elemental) particles from a source.

The deposition may also include redeposition products or evaporation products. The deposition may also include a cap layer as protection layer including such sputtered particles, for example after use of an apparatus with a source that sputters particles, or including a deposition from material including one of more elements selected from the group consisting of B, C, Si, Ge and Sn. The term "element" in the phrase "wherein the deposition includes one or more elements selected from B, C, Si, Ge and Sn," or "wherein the cap layer includes one ore more elements selected from B, C, Si, and Ge," herein refers to a deposition or cap layer including these elements, or including particles including such elements, or including compounds such as Si oxides, Si carbides, etc., including these elements, or combinations thereof, as will be known to one of ordinary skill in the art. The phrase "deposition including one or more elements selected from B, C, Si and Ge," may refer to mono- or multi-layers including atomic B, C, Si or Ge, or combinations thereof.

The phrase "a starting material including one or more elements selected from B, C, Si and Ge" refers to gasses (e.g. hydrides), compounds (e.g. Si oxide), metals and elements of B, C, Si and Ge. The phrase "a gas including one or more elements selected from B, C, Si and Ge," refers to these elements in the gas phase and/or to volatile compounds of B, C, Si and Ge, for example hydrides, although also other volatile compounds might be chosen such as metal-hydrocarbon compounds, for example tetra methyl silane, tetra ethyl silane, etc., as will be understood by those of ordinary skill in the art. The starting material (or the gas) can be used to provide the species that are able to generate a deposition. For example, $SiH_4$ gas may attach to the surface of an optical element and generate, by heat of a hot filament or by radiation etc., a Si cap layer. Herein, the species is the starting material itself. Further, e.g. $SiH_4$ may de converted to species like $SiH_2$ and Si, that may form a Si cap layer or deposition on the optical element. Herein the species are $SiH_2$ and Si. In another example, the starting material is e.g. SiO or $SiO_2$ and by a PVD process Si elements are provided that form a deposition on the optical element. Here the species are Si elements. Hence, the phrase "species that are able to generate a deposition" refers to the starting materials or intermediate products or elements that are able to generate the deposition or cap layer, and the term "starting material" refers to elements, gases, metals, metal oxides etc, that may provide by e.g. a chemical vapor deposition process or a physical vapor deposition process the species that generate the deposition or cap layer on the optical element by these processes. As will be understood by those of ordinary skill in the art, as there may be some oxygen left in an apparatus for EUV application, notwithstanding the presence of gasses like Ar, etc., the deposition or cap layer on the optical element may also include oxides. Further, due to the presence of hydrocarbons, carbides or oxycarbides may also be formed.

The terms "radiation" and "beam" as used herein encompass all types of electromagnetic radiation, including ultraviolet (UV) radiation (e.g. having a wavelength λ of 365, 248, 193, 157 or 126 nm) and extreme ultra-violet (EUV or soft X-ray) radiation (e.g. having a wavelength in the range of 5-20 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. As will be understood by those of ordinary skill in the art, radiation having a wavelength in the range of e.g. 5-20 nm relates to radiation with a certain wavelength band with, of which at least part of it is found in the range of 5-20 nm.

Figure 2:
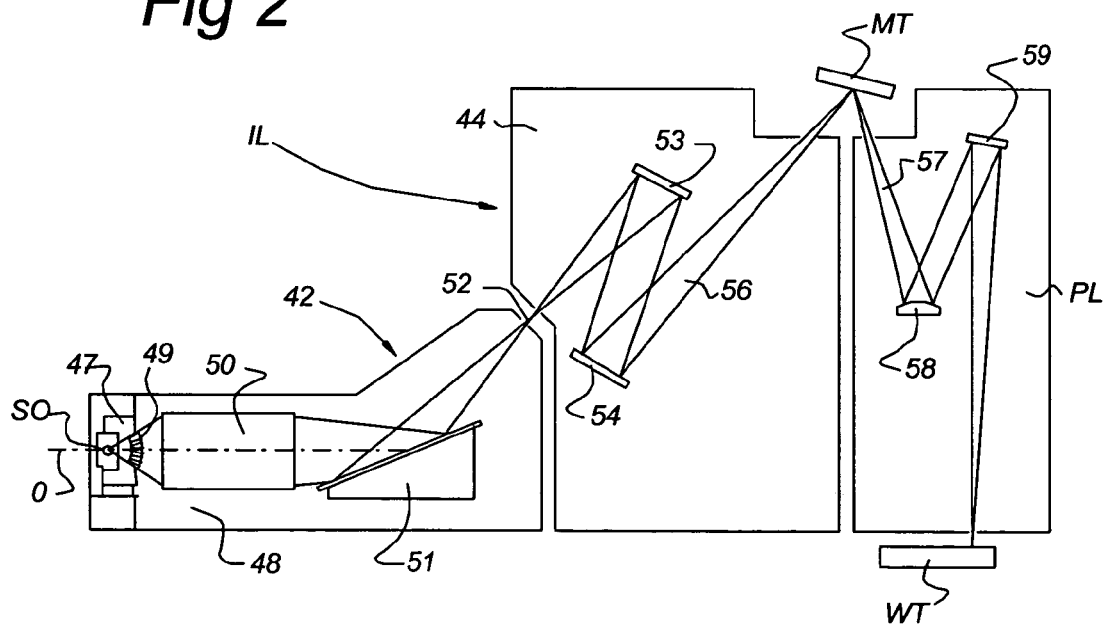
FIG. 2 schematically depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection system PL. The radiation system 42 includes the radiation source SO which may be formed by a discharge plasma. EUV radiation may be produced by a gas or vapor, such as Xe gas, Li vapor or Sn vapor in which a very hot plasma is created to emit radiation in the EUV range of the electromagnetic spectrum. The very hot plasma is created by causing a partially ionized plasma of an electrical discharge to collapse onto an optical axis O. Partial pressures of 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier structure or contamination trap 49 which is positioned in or behind an opening in source chamber 47. The gas barrier structure/contamination trap 49 includes a channel structure such as, for example, described in detail in U.S. Pat. Nos. 6,614,505 and 6,359,969.

The collector chamber 48 includes a radiation collector 50 which may be formed by a grazing incidence collector. Radiation passed by collector 50 is reflected off a grating spectral filter 51 to be focused in a virtual source point 52 at an aperture in the collector chamber 48. From collector chamber 48, a radiation beam 56 is reflected in illumination optics unit 44 via normal incidence reflectors 53, 54 onto a reticle or mask positioned on reticle or mask table MT. A patterned beam 57 is formed which is imaged in projection system PL via reflective elements 58, 59 onto wafer stage or substrate table WT. More elements than shown may generally be present in illumination optics unit 44 and projection system PL.

The radiation collector 50 may be a collector as described in European patent application 03077675.1, which is incorporated herein by reference.

Figure 3:
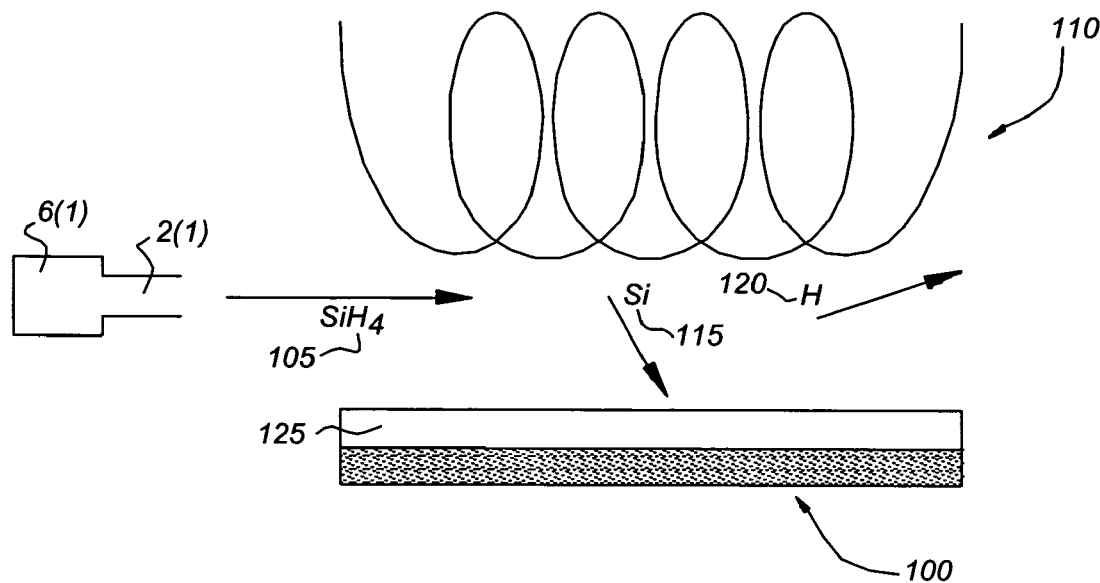
FIG. 3 schematically depicts how a cap layer can be generated according to an embodiment of the present invention.

All optical elements shown in FIG. 2, and optical elements not shown in the schematic drawing of this embodiment, are vulnerable to deposition of, for example, Sn. This is especially the case for optical elements the radiation collector 50 and the grating spectral filter 51. Hence, the method of the present invention can be applied to those optical elements, but also to normal incidence reflectors 53, 54 and reflective elements 58, 59. FIG. 3 schematically depicts how a cap layer can be generated to such optical elements according to an embodiment of the present invention.

FIG. 3 schematically depicts a part of the surface of an optical element 100 and is intended to schematically describe the process of providing a cap layer 125 to the optical element 100 by a deposition process. It should be understood that optical element 100 can be a collector 50, a grating spectral filter 51, it can be a multi-layer mirror such as a Si/Mo multi-layer mirror, with for example a Ru coating, etc.

A gas 105, that may provide species that can generate the formation of a cap layer 125 (in this embodiment $SiH_4$ has been taken as example of a gaseous starting material) is introduced by a gas supply 6(1) through an inlet 2(1). The deposition of Si is realized due to the presence of a species providing device, in this embodiment a hot filament 110, that provides a species that can be deposited, which produces amongst others species Si 115, which forms deposition or cap layer 125, and further hydrogen 120. The hot filament 110 may be a W (tungsten) or Ta (tantalum) wire or coil, which can be heated to e.g. 1500-3000 K or even above, depending upon the kind of material and desired temperature and required temperature to dissociate the chemical bonds of the species in gas 105, such that cap layer 125 can be formed due to the deposition of Si 115. For example, about 20A can be sent through a thin wire of Ta. The filament reaches a typical temperature of around 2000-2300 K (for W typically about 1700-2500 K), and this temperature is high enough to break the Si—H bond or C—H bond of hydrocarbons or silanes, producing hydrogen radicals. Si particles (especially atoms) 115 are formed and will deposit on the optical element 100 as deposition or cap layer 125. Hydrogen radicals or hydrogen gas 120 is also formed.

$SiH_4$ is a volatile compound. The partial pressure of $SiH_4$, and other parameters like gas flow of gas 105, temperature of optical element 100, temperature of gas 105, temperature of filament 110, etc., maybe selected and controlled such that a desired deposition rate is obtained.

Instead of $SiH_4$, gas 105 may also include other silanes or Si-compounds that form Si upon heating with a hot filament 110, but gas 105 may also include hydrocarbons, like $CH_4$, ethane, propane, (iso-)butane, etc., or combinations of two or more of these, or combinations of Si and C compounds that are able to form deposits. In this way Si can be deposited with typical growth rates of up to about 30-60 nm/min. C can be grown with growth rates of up to about 30-60 nm/min. Layer thicknesses of cap layer 125 of Si, C or both Si and C can be between about 0.5 and 20 nm, for example between about 1 and 5 nm. The cap layer has a roughness between about 1-50% of the layer thickness, for example between about 10 and about 20% of the layer thickness. Instead of or next to Si and/or C, also B and/or Ge can be selected as material to be deposited on optical element 100.

Filament 110 may be placed at a distance of about 0.1 to 50 cm from optical element 100, depending upon the kind of optical element, the temperature that is applied and the local pressure in the apparatus at the place of filament 110 and optical element 100. It should be appreciated that filament 110 may include a number of filaments, arranged at appropriate distances of the surface of optical element 100. It should also be appreciated that filament 110 (or filaments) may be heated (individually) in a controlled way by power supplies (not shown) and further controlled by thermo-elements or other devices (also not shown) that may optically measure the temperature of the optical element 100, or the local temperature of a part of optical element 100 or of the temperature of the space, or of part of the space between optical element 100 and filament 110. It should also be understood that layer 125 is deposited in time and thus FIG. 3 schematically shows a certain moment in time where such layer 125 is present.

Figure 4:
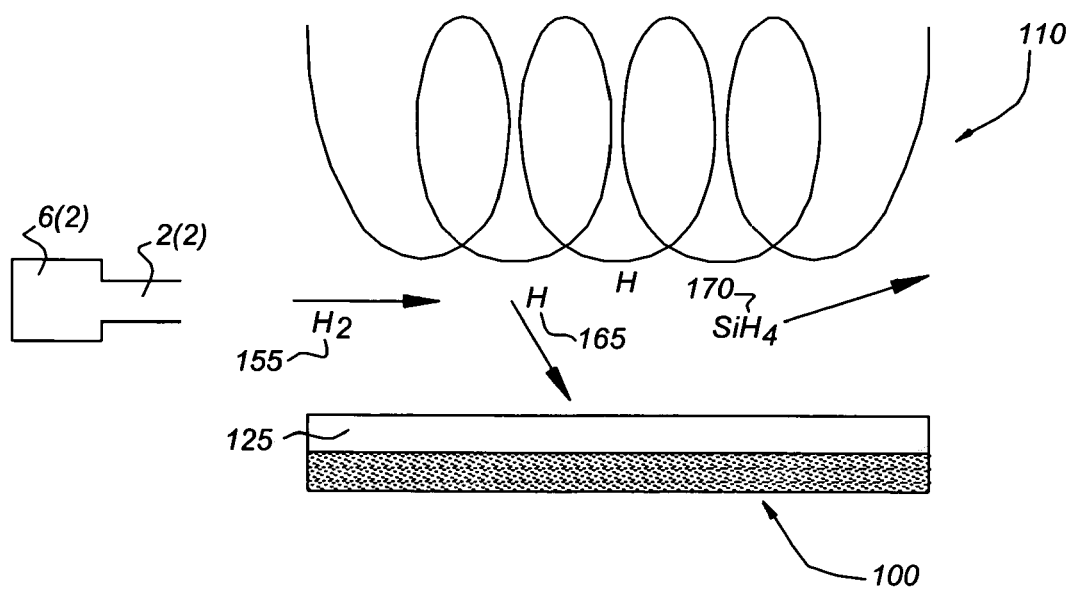
FIG. 4 schematically depicts how a deposition or cap layer can be removed according to an embodiment of the present invention.

During at least part of the use of the apparatus, for example a lithographic apparatus, Sn may deposit on at least part cap layer 125 or damage and remove at least part of cap layer 125, due to emission of the source SO (not shown). After use of optical element 100, cap layer 125 may appear to be damaged and may include elements such as Sn, which are not desired or which may potential harm optical element 100, and therefore cap layer 125 may be removed and replaced by a fresh cap layer 125. FIG. 4 also schematically depicts a part of the surface of optical element 100 and is intended to schematically describe the process of removing a deposition or cap layer 125. Layer 125 may be the cap layer as described above in FIG. 3, it may also be such cap layer 125 after use of an apparatus including optical element 100 with cap layer 125, wherein, due to the use the cap layer, next to one or more elements selected from B, C, Si and Ge, cap layer 125 also includes Sn, for example, from source SO (shown in FIGS. 1 and 2), or layer 125 may mainly or entirely include undesired deposition such as Sn or hydrocarbons from plastic tubes or rest gasses, etc.

Referring to FIG. 4, a gas 155 including $H_2$ is provided by gas supply 6(2) through inlet 2(2) in the space where optical element 100 is present. Due to the presence of hot filament 110, hydrogen gas dissociates in hydrogen radicals 165. Part of the hydrogen radicals 165 will come into contact with deposition or cap layer 125 on the surface of optical element 100, where the hydrogen radicals 165 may react with one or more of Si (including Si oxides), Sn (including tin oxides) and C, etc. In this way, optical element 100 with deposition 125 is brought into contact with at least part of the hydrogen radicals 165 and at least part of the deposition 125 is removed. Volatile hydrides 170 are formed, which in FIG. 4 are indicated as $SiH_4$, but which can also include tin hydrides and/or hydrocarbons such as $CH_4$, etc. Volatile compounds 170 may be at least partially removed by an exhaust or pump (not shown in FIGS. 3 and 4). However, one or more getter plates may also be provided, on which the hydrides may form deposits, which are then not detrimental to the optical elements anymore. Removal rates of 100-150 nm/hour may be obtained. Growth and removal rates may be derived from ex situ X-ray fluorescence spectroscopy. In this way, a method is used wherein cap layer 125 is provided to optical element 100 by a deposition process; and wherein during or after use of the apparatus at least part of cap layer 125 is removed from optical element 100 in a removal process. Optical element 100 is protected during use, and may continuously be used, due to a refreshment of cap layer 125. After some time of use, optical element 100 with cap layer 125 may be subjected to above mentioned removal process including providing an $H_2$ containing gas 155 in at least part of the apparatus; producing hydrogen radicals 165 from $H_2$ from the $H_2$ containing gas; and bringing optical element 100 with the cap layer 125 into contact with at least part of the hydrogen radicals 165 and removing at least part of cap layer 125. Without the use of halides, as suggested in the prior art, which may damage parts of the apparatus including the optical element 100, the deposition or cap layer 125 may at least be partially be removed, thereby removing damaged cap layer 125 or a cap layer 125 including Sn. Even Sn that may have oxidized may be removed by hydrogen radicals 165 as Sn hydride. These volatile compounds may be removed from the apparatus by an exhaust (not shown). By performing the method of the present invention, optical element 100 is protected from Sn by cap layer 125, leading to better optical properties and a longer lifetime of optical element 100. For example, reflection loss due to Sn can be diminished, and protective cap layer 125 can easily be renewed for prolonged life time of optical element 100. Next to that, cap layer 125, including one or more selected from B, C, Si and Ge, is relatively transmissive for EUV radiation, such that radiation is substantially not diminished by cap layer 125.

In this embodiment, the device that produces hydrogen radicals is a filament 110, and the device that provides deposition from one or more selected from B, C, Si and Ge is also a filament 110. These filaments can be the same or can be different filaments 110.

Gas supplies 6(1) and 6(2) and inlets 2(1) and 2(2) may be the same gas supplies and inlets, respectively. Further, this inlet can be a normal inlets that may be used to introduce gasses in the apparatus or to remove gasses from the apparatus. Hence, these supplies and inlets, as will be appreciated by those of ordinary skill in the art, represent those devices that enable introduction and, where applicable, enable removal of gasses from the apparatus or parts of the apparatus which include optical element 100. The devices may contain pumps, vessels, (partial) pressure means, flow controllers, valves, exhausts, etc., as should be appreciated by those of ordinary skill in the art.

The cap layer 125 does not only protect optical element 100 against sputtering products or electrons from a source, it also protects optical element 100 against chemical attacks of, for example, oxygen or water.

In a variation of this embodiment, FIG. 4 may refer to an optical element 100 which includes a mirror 58 or 59 (see FIG. 2), or another mirror or optical element 100 that may be present in projection system PL (in this system PL, 6 mirrors may be present, for example). Optical elements present in the projection system PL and also other parts of the apparatus may include deposition 125, formed by outgassing of Si from the resist on the wafer on waver table WT (see FIGS. 1 and 2). According to the method depicted in FIG. 4, this deposition may be removed with hydrogen radicals 165, generated by hot filament 110 or by other devices described herein. Further, gas supply 6(2) may provide hydrogen gas 155, but may further provide halogens. Hydrogen radicals may reduce oxides of Si present in deposition 125 to elemental Si, which may further be removed by producing volatile hydrides and halides, respectively. In contrast to methods known in the art using halides only, with the method of the present invention, oxides of, for example, Si and Sn may also be removed.

Referring to FIG. 3, gas 105 including $CH_4$ is introduced by supply 6(1) via inlet 2(1). The deposition of C is realized due to the presence of a hot filament 110, which may be heated to 1500-3000 K, or even above to dissociate the chemical bonds of $CH_4$ in gas 105, such that cap layer 125 can be formed due to the deposition of C 115. Hydrogen radicals or hydrogen gas 120 is also formed. Instead of $CH_4$, other hydrocarbons may also be used.

After use of optical element 100, cap layer 125 may be removed and replaced by a fresh cap layer 125. Referring to FIG. 4, a gas 155 including $H_2$ is provided by supply 6(2) via inlet 2(2) to the space where optical element 100 is present. Due to the presence of hot filament 110, hydrogen gas dissociates in hydrogen radicals 165. Part of the hydrogen radicals 165 will migrate to the deposition or cap layer 125 on the surface of optical element 100, where the hydrogen radicals 165 may react with C or C and Sn (sputtered from the source SO), etc. Volatile hydrides 170 are formed, which in FIG. 4 are indicated as $SiH_4$, but which in this embodiment include hydrocarbons or hydrocarbons and tin hydrides. Volatile compounds 170 may be at least partially removed by an exhaust or pump (not shown in FIGS. 3 or 4).

Figure 5:
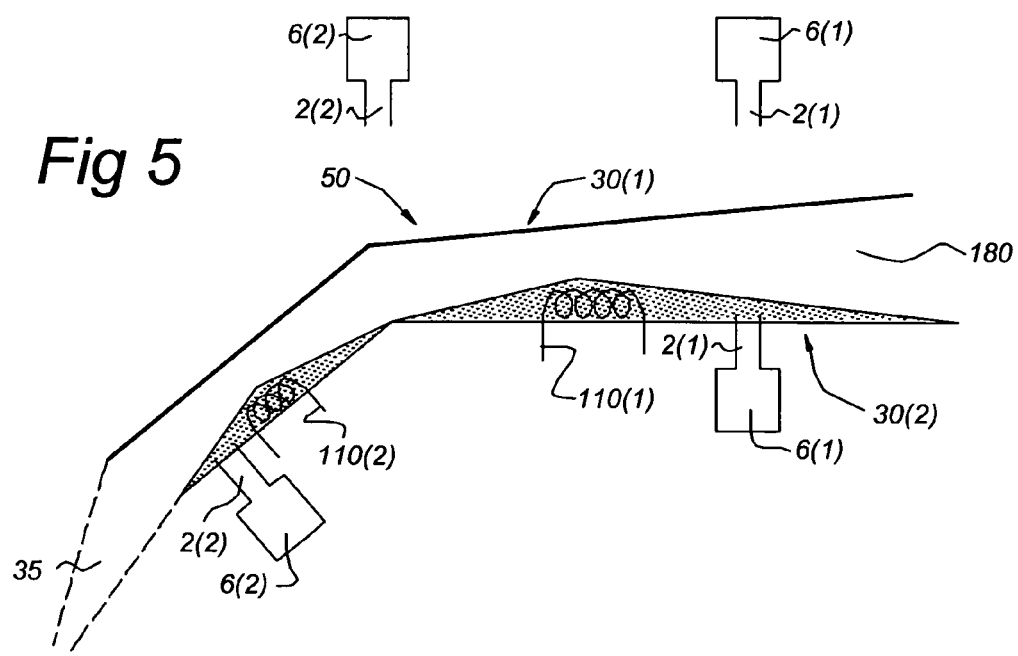
FIG. 5 schematically depicts a part of a collector mirror and filaments according to an embodiment of the present invention.

In an embodiment of the present invention, optical element 100 may be a radiation collector 50 (see also FIG. 2). FIG. 5 schematically depicts a part of a collector 50, including a first mirror 30(1) and a second mirror 30(2). Radiation collector 50 may include more than two mirrors to collect EUV radiation 35 and to a produce radiation beam 56. Within space 180 between mirrors 30(1) and 30(2), there are some parts of space 180 which are arranged outside the EUV radiation 35, i.e., in the shadow of mirror 30(2). These parts of space are indicated by gray areas. For example, these spaces can be used to arrange a filament 110, as indicated in the figure with filaments 110(1) and 110(2). Hydrides of carbon or silicon may enter space 180 and by heating filaments 110, cap layers (not shown) are formed on mirrors 30(1) and 30(2). Likewise, hydrogen gas may enter space 180 and may be at least partially converted by filaments 110 to hydrogen radicals 165, which may remove a undesired deposition such as Sn or a cap layer 125 such as a carbon cap layer, a silicon cap layer or a carbon-silicon cap layer etc., wherein these latter layers may also include Sn from source SO (not shown).

In a variation on this embodiment, gas supplies 6(1) and 6(2) may be positioned in the space where collector 50 is positioned. In a further variation, gas supplies may be positioned in such a way, that inlets 2(1) and 2(2) are also in the parts of space 180 which are arranged outside the EUV radiation 35, i.e., in the shadow of mirror 30(2). FIG. 5 shows examples of positions of the gas supplies 6(1) and 6(2), respectively. It should be appreciated that one or more gas supplies 6(1) and 6(2), respectively, may be positioned in the space where collector 50 (or other mirrors) are present, but only one gas supply 6 with one inlet 2 (not shown) may alternatingly provide the desired gasses.

Figure 6:
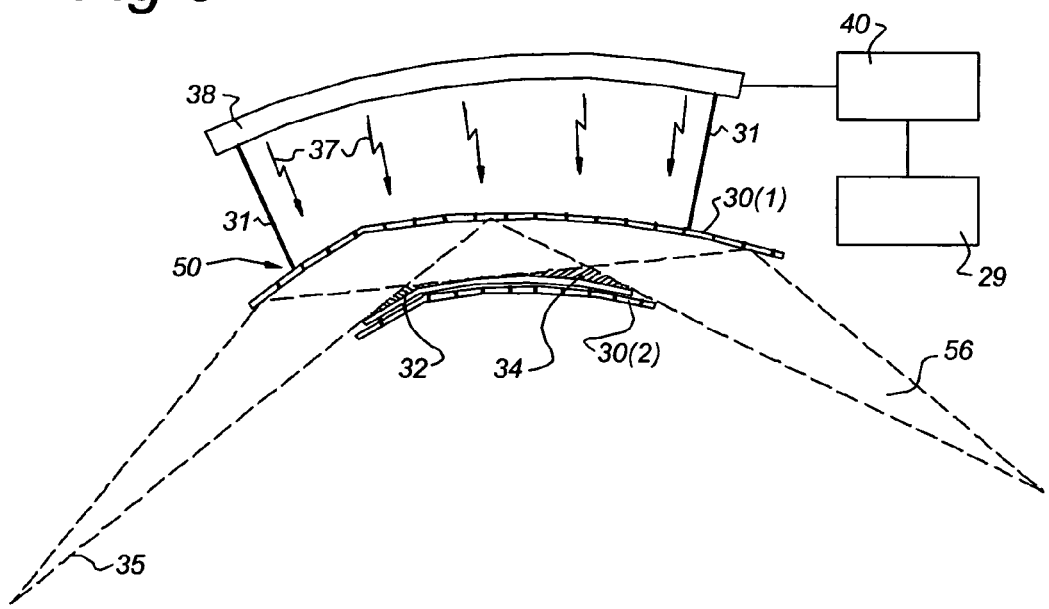
FIG. 6 schematically depicts a part of a collector mirror with temperature controller according to an embodiment of the present invention.

In yet a further embodiment of the present invention, the optical element 100 may be a collector 50, which is further provided with a heating element 38. FIG. 6 schematically depicts a part of a collector 50, including a first mirror of 30(1) and a second mirror 30(2). The radiation collector 50 may include more than two mirrors to collect EUV radiation 35 and to produce radiation beam 56. Within space 180 between mirrors 30(1) and 30(2), there are some parts of space 180 which are arranged outside the EUV radiation 35, i.e., in the shadow of mirror 30(2). These parts of space are indicated by gray areas with reference numbers 32 and 34. For example, these spaces can be used to arrange a filament 110 (as shown in FIG. 5). FIG. 6 schematically shows a heating element 38 controlled by a controller 40. The heating element source 38 may be connected to mirror 30(1) by connectors 31. The connectors 31 may be heated conductively. The controller 40 may be implemented as a suitably programmed computer, or a controller with suitable analog and/or digital circuits. The heating element 38 generates heat, indicated with arrows 37, which is directed to the first mirror of 30(1) of radiation collector 50. Heating element 38 may also be physically connected to mirror 30(1). Heater 38 may include different heating elements and/or may be arranged such that different areas of mirror 30(1) can selectively be heated. In this way, layer growth and layer removal of a cap layer may better be controlled. Heating element 38 may be controlled by controller 40, which may also control a pump 29, or measuring devices such as thermo-couples, gas pressure, gas flow, an analysis unit that analyzes reflectivity of mirror 30(1), an analysis unit that measures cap layer thickness, etc (not shown in FIG. 6, but some ofthese devices are shown in FIG. 7).

Figure 7:
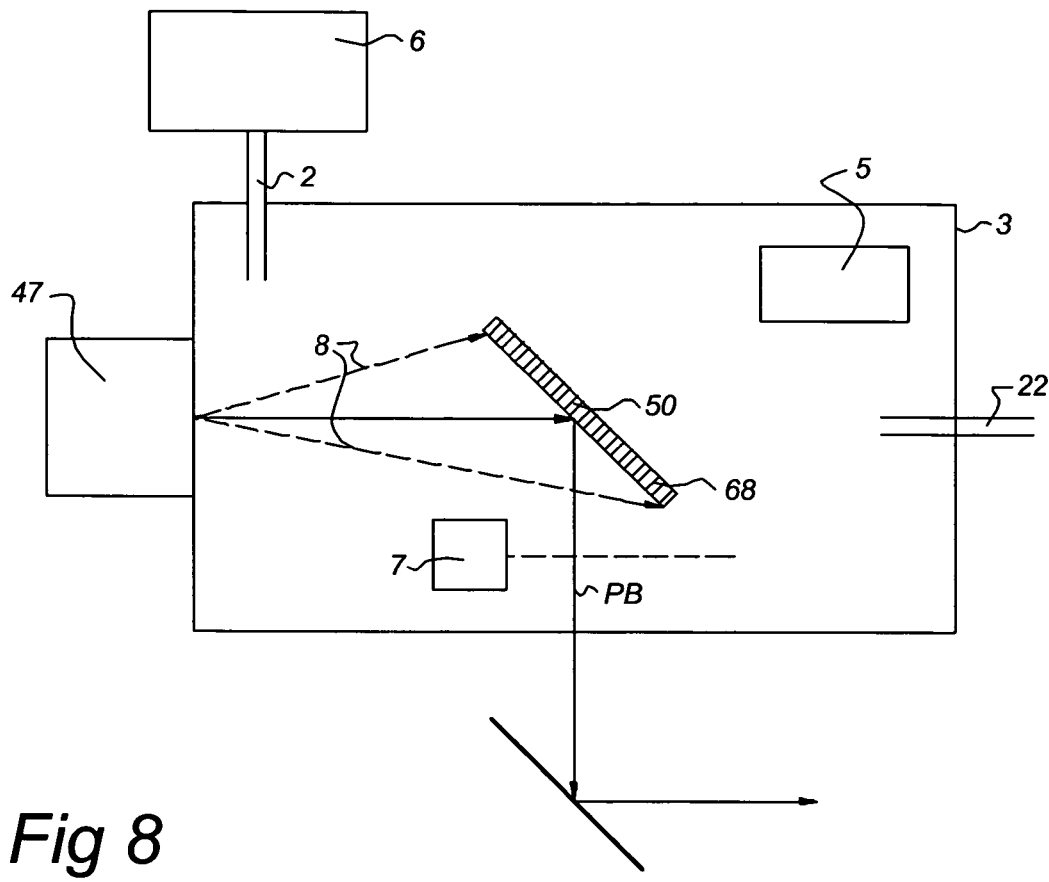
FIG. 7 schematically depicts an arrangement of a mirror according to an embodiment of the present invention.

In yet a further embodiment of the present invention, as schematically shown in FIG. 7, optical element may be a radiation collector 50, which may be a multilayer mirror, which is further provided with a heating element 68. Such multilayer mirror may include at least 40 layers, or at least 50 layers, at least 60 layers, and may further include a Ru protection layer (top layer).

The system as depicted in FIG. 7 includes a source chamber 47 which radiates radiation into a chamber 3, which may be a part of collector chamber 48 (shown in FIG. 2) or may be collector chamber 48 itself. The system includes a gas supply 6 to supply a hydrocarbon gas, a silane gas, or both. The supply includes a source of the required gas 6 and an inlet 2 (in this figure, only one gas supply 6 is shown, but more supplies may be present, see for example FIGS. 3-5). Gas is supplied to chamber 3 and the partial pressure of the gases in chamber 3 may be monitored via the sensor 5 (which may be coupled to a controller, for example controller 40 in FIG. 5). A reflectivity sensor 7 may be provided and may be used to determine when the reflectance of collector 50 decreases or increases, due to sputtering of Sn, growth of Si, and/or C, etc., layers and removal of deposition or cap layers 125, respectively. Further, outlet 22 may be provided to remove hydrogen gas, hydrides and where applicable halides. Although this embodiment describes multilayer mirrors, it is not intended to limit the present invention. One alternative is a grazing incidence mirror, mirrors onto which radiation is directed at an angle smaller than about 20°, which do not necessarily include multilayers, but can be manufactured of a single metal layer. Such mirrors degrade as well when exposed to the atoms and ions generated by the EUV radiation source. The same methods can also be applied to these mirrors.

Outlet 22 may be used as exhaust for removing, for example, $H_2$, hydrocarbons, etc., but also for removing, for example, volatile (by) products formed in the methods of the invention, such as $H_2O$, hydrides and halides of Sn, Si, B, C, Ge and hydrocarbons which may be formed, such as $C_2H_4$, etc. Such outlets may also be present at other places, for example close to optical element 100 in FIGS. 3, 4, 5 and 6.

Figure 8:
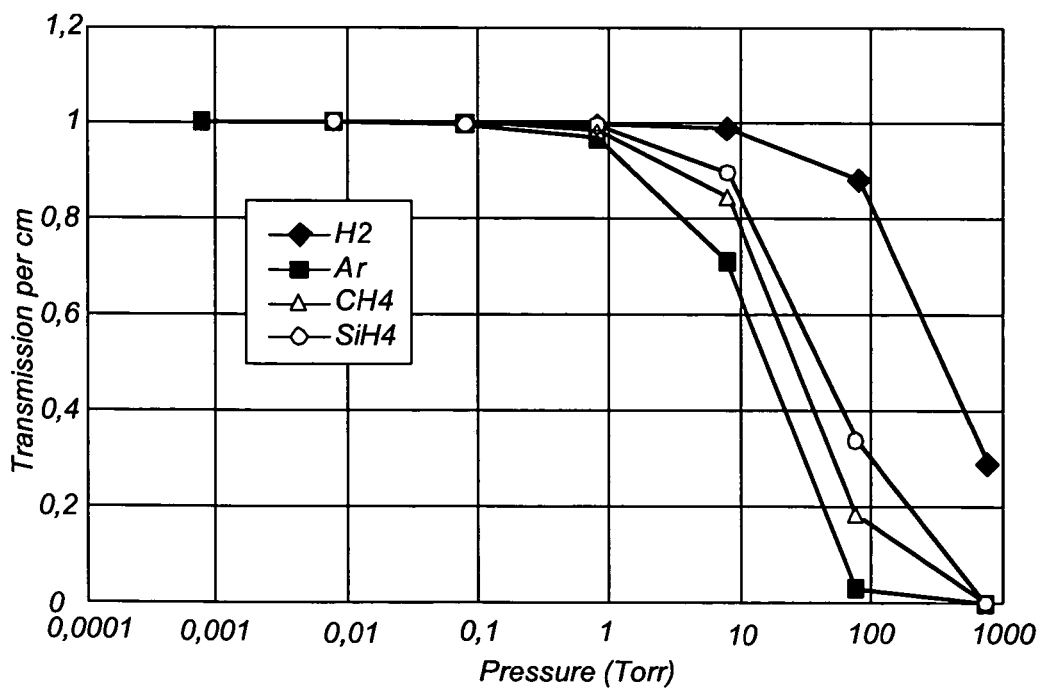
FIG. 8 schematically depicts the transmission of $H_2$, $CH_4$, $SiH_4$ and Ar gasses relative to the pressure.

An application of the method for providing a cap layer 125 will be described with reference to FIGS. 2-4. Using a chemical vapor deposition technique such as hot-filament deposition, silicon or carbon can be deposited on and etched from optical element 100. This gives a thin layer 125 of Si or C (or a layer of Si and C), etc., as cap layer on the optic element(s), which will protect it from etching by fast ions coming from the source SO. The layer 125 may be dynamic, because cap layer 125 may continuously be etched and deposited in order to keep a cap layer of a certain thickness and roughness. This can be done in three separate processes, namely (1) deposit layer 125, then (2) operate lithographic apparatus, and (3) stop apparatus and etch away layer 125 (which may be diminished and damaged by the fast atoms and ions such as Sn from the source SO and which may also include Sn, next to C, Si or both Si and C). Alternatively, in yet another embodiment, all three processes can be done simultaneously, using online etching and deposition during lithography operation. Materials that can be used as dynamic cap layer 125 are Si, C, B and Ge, or combinations of two or more of these elements can be used. Etching and depositing of the silicon (or B, C, Ge) layer can be done online, i.e. when the EUV lithography machine is running. This means that while irradiating the optical element 100 with the radiation beam at least part of cap layer 125 is provided to optical element 100 or that while irradiating optical element 100 with the radiation beam at least part of cap layer 125 is removed from optical element 100, respectively. This might be possible if the pressures of the gasses can be high enough. Hydrogen has a very good transmission for EUV radiation, which means that online etching may also be possible. Fortunately, $SiH_4$ (a source for Si deposition) and $CH_4$ (a source for C) have a very good transmission for EUV radiation and have even a better transmission than argon, which is a widely used buffer gas at the moment, see FIG. 8, wherein the transmission of those gasses, relative to the pressure, is given. When deliberately introducing these gasses as gas 105 or 155, respectively, the pressure difference between the chambers or closed part of a chamber (e.g. radiation system 42 in FIG. 2 or chamber 3 in FIG. 7) with connecting chambers or connecting other parts of the chambers, respectively, needs not be very large. Further, $SiH_4$ and $CH_4$ may serve as buffer gasses for EUV debris suppression as well.

Different spots on optical element 100 may experience different etching rates due to the fast ions from the source and deposition rates. This makes it difficult to achieve equilibrium with a uniform cap layer thickness over the entire surface of the optical element 100. This might be solved with temperature gradients over the optical element 100 by heating elements (see for example FIGS. 6 and 7), in order to increase the etch rates in certain parts of optical element 100. Cooling elements may also be used. Hence, a part or parts of optical element 100 may be heated while providing cap layer 125 to optical element 100 or while removing cap layer (or deposition) 125 and a part or parts of optical element 100 may be cooled while providing cap layer 125 to optical element 100, such that a uniform cap layer 125 can be provided and cap layer 125 can also uniformly be removed, at least partially. Cooling may be performed with peltier elements; heating may be performed with heating elements and also with IR radiation. Other ways to control the thickness and uniformity of cap layer 125 may be by varying the pressures, of the gas, the temperature of filament 110, distance of filament 110 to optical element 100, or individual temperatures and distances of different filaments 110, etc.

In another embodiment, cap layer 125 is generated by physical vapor deposition (PVD). To this end, elemental B, C, Si or Ge, or combinations of one or more of these elements is introduced in an apparatus including optical element 100 in such a way that a cap layer 125 is formed on optical element 100. For example, a beam of electrons hits a starting material including B, C, Si or Ge, which leads to a formation of species that are able to generate a deposition by sputtering and/or evaporation of elements and/or particles of B, C, Si or Ge, respectively. Physical vapor deposition may be performed in situ of a lithographic apparatus, thereby providing an on line deposition technique, or ex situ in a PVD apparatus, thereby providing an off line technique.

In this embodiment, the deposition generator generates a deposition selected from one or more B, C, Si and Ge and is a source of radiation, for example a source providing an electron bombardment. After or during use of the optical element, cap layer 125 may be removed by using a hydrogen radical generator, such as a filament that can be heated, a plasma generator, a source of radiation, which may be the same source, and a catalyst to convert $H_2$ into hydrogen radicals.

In another embodiment, referring to FIG. 4, next to hydrogen 155, halogens may also be introduced. For example Sn, which may have been partly oxidized by the presence of oxygen, can be reduced with hydrogen radicals 165, produced by hot filament 110. Sn may than further be removed as $SnH_4$ 170 but also as Sn halide. For example, next to hydrogen, gas 155 may also include $Cl_2$ or $I_2$. Less halogen has to be used than in currently known processes. The same applies for a Si or Ge cap layer or deposition.

In yet another embodiment, instead of filament 110, a plasma generator is used to generate hydrogen radicals 165. This generator may be a high voltage generator, for example about 5-10 kV, between two electrodes, thereby forming a plasma. Due to the presence of this plasma, hydrogen from gas 155, including hydrogen, is at least partially converted to hydrogen radicals 165.

Such plasma may also be used to generate Si from gas 105 including silanes as starting material or C from gas 105 including hydrocarbons as starting material, respectively. In this embodiment, the hydrogen radical generator is a plasma, and the deposition generator to generate a deposition from one or more of B, C, Si and Ge may be filament 110, the plasma or a source of radiation.

In yet another embodiment, next to filament 110, a catalyst to convert $H_2$ into hydrogen radicals is used. This may be a Ru containing catalyst such as zeolite including Ru or alumina with Ru, or other metals such as Rh, Ir, Pt, Pd, etc. Due to the presence of the catalyst to convert $H_2$ into hydrogen radicals, hydrogen from gas 155, including hydrogen, are at least partially converted to hydrogen radicals 165. In a variation on this embodiment, the catalyst and optical element 100 include a Ru layer, which may be a Ru protection layer on optical element 100 such as a mirror, for example a multilayer mirror, grazing incidence mirror, etc. In this embodiment, hydrogen radical generator is a catalyst, and the deposition generator may be filament 110, or another device to provide cap layer 125.

In the context of this embodiment, especially in the context of a Ru layer on an optical element, hydrogen gas molecules may be dissociated on the surface of Ru, leading to hydrogen atoms being chemisorbed to the surface. The hydrogen atoms may migrate to e.g. Sn and remove Sn as hydride or migrate to Sn oxides (e.g. $SnO/SnO_2$) and reduce them to Sn. Hydrogen atoms may also be formed on the surface in close proximity of Sn or Sn oxides (or Si and $SiO/SiO_2$, respectively, etc.) and remove Sn or reduce SnO, respectively. Elemental Sn may then be removed by hydrogen radicals, hydrogen atoms bound to the surface of the Ru layer and by halides (see also e.g. embodiments 1 and 8).

In yet another embodiment, a cap layer 125 is generated by introducing hydrocarbons to the apparatus and providing hydrocarbons in the proximity of optical element 100. Due to irradiation with a source, the hydrocarbons which are attached (e.g. due to Van der Waals forces) to the surface of optical element 100 are at least partially converted to a cap layer 125 including C. The source may provide EUV, DUV or UV radiation. Alternatively or additionally, a source may be used that provides electrons, which may also convert hydrocarbons to C, such that a cap layer 125 including C is provided. In a variation on this embodiment, e.g. the source of radiation may be source SO (see FIGS. 1 and 2) and/or a separate source of radiation.

In this embodiment of the present invention, optical element 100 including deposition or cap layer 125 is removed from the apparatus that includes this optical element 100, and the deposition or cap layer removal process is performed ex situ in another setup by providing an $H_2$ containing gas in at least part of this setup; producing hydrogen radicals from $H_2$ from the $H_2$ containing gas; and bringing the optical element 100 with the cap layer 125 into contact with at least part of the hydrogen radicals 165 and removing at least part of the cap layer 125 from optical element 100 in this setup.

In this embodiment of the present invention, optical element 100 is removed from the apparatus that includes this optical element 100, and the deposition to generate cap layer 125 is performed ex situ in another setup by a deposition generator, wherein the deposition includes one or more elements selected from B, C, Si and Ge. Alternatively, also a thin layer of Sn may be deposited, for example a few nm, such as about 1-50 nm, or about 2-40 nm.

In this embodiment, cap layer 125 is removed after a certain period of use in an apparatus. The removal is performed to a certain reference value (e.g. reflection of optical element 100, in case optical 100 is a mirror or grating), to be detected by sensor 7 of FIG. 7. This process can be repeated after each use of the apparatus or after some time of use of the apparatus. The cap layer 125 does not necessarily need to be completely removed, but only needs to be removed until a certain reference value is obtained. After having removed part of cap layer 125, fresh cap layer 125 can be generated, until a second reference value is obtained. In this way, a fresh uniform layer can be obtained, either after a complete removal of cap layer 125 or after a partial removal of cap layer 125.

In this embodiment, the apparatus is a lithographic apparatus for lithography and the beam of radiation includes radiation. Optical element 100 is an optical element, for example a diode to sense radiation intensity, or a diode to sense optical properties of other optical elements 100, or a sensor 7 as in FIG. 7 to measure the reflectivity of a mirror, or a sensor for alignment, etc. The lithographic apparatus may be designed to irradiate the optical element with a beam of radiation, for example in the case of a sensor to sense the radiation intensity, but the sensors mentioned above may also be present in the apparatus at position where no direct radiation is present. A cap layer 125 may be generated that is substantially transparent for radiation, for example a few nm of Si.

According to another embodiment, the apparatus includes a lithographic apparatus, for example the apparatus according to FIG. 2, designed for EUV lithography.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention is not limited to application of the lithographic apparatus or use in the lithographic apparatus as described in the embodiments. Further, the drawings usually only include the elements and features that are necessary to understand the invention. Beyond that, the drawings of the lithographic apparatus are schematically and not on scale. The invention is not limited to those elements, shown in the schematic drawings (e.g. the number of mirrors drawn in the schematic drawings). Further, the invention is not confined to the lithographic apparatus described in FIGS. 1 and 2. The person skilled in the art will understand that embodiments described above may be combined. Further, the invention is not limited to protection against, for example Sn from a source SO, but also other particles from other sources, such as radiation sources that may damage optical element 100, may be removed with the methods of the present invention. The methods for protection of an optical element may also be applied likewise with respect to such other particles. The embodiments that mention, for example only C or Si, may also be directed to B, Ge and Sn. Further, cap layer 125 may be generated by a deposition process providing a cap layer 125 including other elements than B, C, Si and Ge, when cap layers 125 including such elements can at least partially be removed by hydrogen radicals.

What is claimed is:

1. A method for the removal of a deposition on an optical element of an apparatus including the optical element, the method comprising:
    providing an optical element having a protective deposition;
    providing an $H_2$ containing gas in at least part of the apparatus;
    producing hydrogen radicals from $H_2$ from the $H_2$ containing gas; and
    removing at least part of the protective deposition from the optical element by having the optical element be in contact with at least part of the hydrogen radicals.

2. The method according to claim 1, wherein the deposition comprises one or more elements selected from B, C, Si, Ge and Sn.

3. The method according to claim 1, wherein at least part of the hydrogen radicals are generated from $H_2$ from the $H_2$ containing gas by a filament, a plasma, radiation, or a catalyst configured to convert $H_2$ into hydrogen radicals.

4. The method according to claim 1, wherein the $H_2$ containing gas further comprises a halogen gas.

5. The method according to claim 1, wherein the apparatus is a lithographic apparatus.

6. The method according to claim 1, wherein the optical element comprises an optical element selected from the group of a mirror, a grating, a reticle and a sensor.

7. The method according to claim 1, wherein the at least part of the deposition is removed ex situ from the apparatus including the optical element.

8. A method for the protection of an optical element of an apparatus including the optical element, the method comprising:
    providing a cap layer to the optical element by a deposition process; and
    during or after use of the apparatus, removing at least part of the cap layer from the optical element in a removal process comprising:
        providing an $H_2$ containing gas in at least part of the apparatus;
        producing hydrogen radicals from $H_2$ from the $H_2$ containing gas; and
        removing at least part of the cap layer by having the optical element be in contact with at least part of the hydrogen radicals.

9. The method according to claim 8, wherein the deposition process comprises:
    providing a starting material comprising one or more elements selected from B, C, Si and Ge;
    providing, from the starting material, a species comprising one or more elements selected from B, C, Si and Ge that is able to generate a deposition; and
    bringing the species that is able to generate a deposition into contact with at least part of the optical element.

10. The method according to claim 8, wherein the species that is able to generate a deposition is generated by a filament, a plasma or radiation.

11. The method according to claim 8, wherein the cap layer comprises one or more elements selected from B, C, Si and Ge.

12. The method according to claim 8, wherein the use of the apparatus comprises irradiating the optical element with a radiation beam.

13. The method according to claim 8, wherein at least part of the hydrogen radicals are generated by a filament, a plasma, radiation, or a catalyst configured to convert $H_2$ into hydrogen radicals.

14. The method according to claim 8, wherein the $H_2$ containing gas further comprises a halogen gas.

15. The method according to claim 8, wherein the apparatus is a lithographic apparatus.

16. The method according to claim 8, wherein the optical element comprises an optical element selected from the group of a mirror, a grating, a reticle and a sensor.

17. The method according to claim 8, wherein at least part of the cap layer is generated ex situ from the apparatus including the optical element.

18. The method according to claim 8, wherein the at least part of the cap layer is removed ex situ from the apparatus including the optical element.

19. An apparatus, comprising:
    an optical element having a protective deposition;
    an inlet configured to provide an $H_2$ containing gas in at least part of the apparatus; and
    a hydrogen radical generator configured to generate hydrogen radicals from $H_2$ from the $H_2$ containing gas and to remove at least part of the protective deposition from the optical element by having the optical element be in contact with at least part of the hydrogen radicals.

20. The apparatus of claim 19, wherein the hydrogen radical generator comprises one or more devices selected from the group of a filament that can be heated, a plasma generator, a source of radiation, and a catalyst configured to convert $H_2$ into hydrogen radicals.

21. The apparatus of claim 19, wherein the apparatus is a lithographic apparatus.

22. The apparatus of claim 19, wherein the optical element comprises an optical element selected from the group of a mirror, a grating, a reticle and a sensor.

23. The apparatus of claim 19, further comprising a heating element configured to heat at least a part of the optical element.

24. The apparatus of claim 19, further comprising a cooling element configured to cool at least a part of the optical element to establish a temperature gradient across the optical element during removal of the at least part of the protective deposition.

25. The apparatus of claim 19, further comprising a reflectivity sensor configured to detect reflectance of the optical element.

26. The apparatus of claim 25, configured to continue removing the at least part of the protective deposition until a certain reflectivity value of the optical element measured by the reflectivity sensor is obtained.

27. A method for the removal of a deposition on an optical element of an apparatus including the optical element, and wherein the deposition comprises one or more elements selected from B, Si, Ge and Sn, the method comprising:
   providing an $H_2$ containing gas in at least part of the apparatus;
   producing hydrogen radicals from $H_2$ from the $H_2$ containing gas; and
   removing at least part of the deposition from the optical element by having the optical element be in contact with at least part of the hydrogen radicals.

28. The method according to claim 27, wherein at least part of the hydrogen radicals are generated from $H_2$ from the $H_2$ containing gas by one or more devices selected from the group of a filament that can be heated, a plasma, a source of radiation, and a catalyst configured to convert $H_2$ into hydrogen radicals.

29. The method according to claim 27, wherein the $H_2$ containing gas further comprises a halogen gas.

30. The method according to claim 27, wherein the apparatus is a lithographic apparatus.

31. The method according to claim 27, wherein the optical element comprises an optical element selected from the group of a mirror, a grating, a reticle and a sensor.

32. The method according to claim 27, wherein the at least part of the deposition is removed ex situ from the apparatus including the optical element.

33. The method according to claim 27, wherein the deposition comprises Si.

* * * * *